(12) United States Patent
Larsen et al.

(10) Patent No.: US 9,385,694 B2
(45) Date of Patent: Jul. 5, 2016

(54) LOW-POWER PROGRAMMABLE OSCILLATOR AND RAMP GENERATOR

(71) Applicant: Conexant Systems, Inc., Newport Beach, CA (US)

(72) Inventors: Christian Larsen, Austin, TX (US); Gomathi Komanduru, Irvine, CA (US)

(73) Assignee: CONEXANT SYSTEMS, INC., Irvine, CA (US)

( * ) Notice: Subject to any disclaimer, the term of this patent is extended or adjusted under 35 U.S.C. 154(b) by 0 days.

(21) Appl. No.: 13/719,491

(22) Filed: Dec. 19, 2012

(65) Prior Publication Data

US 2013/0154692 A1 Jun. 20, 2013

Related U.S. Application Data

(60) Provisional application No. 61/578,214, filed on Dec. 20, 2011.

(51) Int. Cl.
| | | |
|---|---|---|
| *H03K 4/06* | (2006.01) | |
| *H03K 4/08* | (2006.01) | |
| *H03K 4/501* | (2006.01) | |

(52) U.S. Cl.
CPC . *H03K 4/08* (2013.01); *H03K 4/501* (2013.01)

(58) Field of Classification Search
USPC .......... 327/131–140, 538–543; 323/315–316
See application file for complete search history.

(56) References Cited

U.S. PATENT DOCUMENTS

| 2,976,460 | A | | 3/1961 | Odd |
| 3,457,452 | A | | 7/1969 | Saper |
| 3,475,695 | A | * | 10/1969 | Kaminski ....................... 331/25 |
| 4,061,949 | A | | 12/1977 | Griffis |
| 5,387,882 | A | * | 2/1995 | Schoofs ........................ 331/111 |
| 6,259,311 | B1 | * | 7/2001 | Azimi et al. .................. 327/553 |
| 6,262,603 | B1 | * | 7/2001 | Mohan et al. .................... 327/77 |
| 6,348,835 | B1 | * | 2/2002 | Sato et al. ..................... 327/543 |
| 6,794,916 | B1 | * | 9/2004 | Varma ........................... 327/218 |
| 6,803,813 | B1 | * | 10/2004 | Pham ............................. 327/553 |
| 6,842,710 | B1 | * | 1/2005 | Gehring et al. ................ 702/107 |
| 7,071,711 | B2 | * | 7/2006 | Bauer et al. ................... 324/678 |
| 7,492,229 | B2 | * | 2/2009 | Pham ........................... 331/36 C |
| 7,742,893 | B2 | * | 6/2010 | Confalonieri et al. ......... 702/107 |
| 7,986,181 | B2 | * | 7/2011 | Confalonieri et al. ......... 327/553 |
| 2004/0218496 | A1 | * | 11/2004 | Sekiya ........................ 369/53.22 |
| 2004/0239404 | A1 | * | 12/2004 | Behzad .......................... 327/512 |
| 2006/0197576 | A1 | * | 9/2006 | Konno ........................... 327/308 |
| 2008/0021823 | A1 | * | 1/2008 | Allin et al. ...................... 705/40 |
| 2008/0042710 | A1 | * | 2/2008 | Cheng et al. ................... 327/175 |

(Continued)

OTHER PUBLICATIONS

Lee, Cheung Fai, et al; A Monolithic Current-Mode CMOS DC-DC Converter With On-Chip Current-Sensing Technique; IEEE Journal of Solid-State Circuits, vol. 39, No. 1, Jan. 2004, pp. 3-14.

*Primary Examiner* — Brandon S Cole
(74) *Attorney, Agent, or Firm* — Haynes and Boone, LLP

(57) ABSTRACT

A circuit for generating a signal comprising a first transistor having a drain, a gate and a source. A second transistor having a drain, a source and a gate coupled to the gate of the first transistor to form a current mirror. A current source coupled to the source of the first transistor. A diode-connected transistor having a drain coupled to the source of the second transistor, a source and a gate that forms an output. A variable resistor having a first terminal coupled to the source of diode-connected transistor and a second terminal. A capacitor coupled to the second terminal of the variable resistor.

18 Claims, 3 Drawing Sheets

(56) References Cited

U.S. PATENT DOCUMENTS

| | | | |
|---|---|---|---|
| 2008/0042763 A1* | 2/2008 | Pham | 331/111 |
| 2008/0191794 A1* | 8/2008 | Chiu et al. | 327/553 |
| 2008/0191795 A1* | 8/2008 | Dharmalinggam et al. | 327/553 |
| 2008/0278223 A1* | 11/2008 | Kernahan et al. | 327/538 |
| 2009/0051401 A1* | 2/2009 | Confalonieri et al. | 327/306 |
| 2009/0322379 A1* | 12/2009 | Tomita | 327/58 |
| 2010/0141348 A1* | 6/2010 | Kang et al. | 331/150 |
| 2010/0164563 A1* | 7/2010 | Bea et al. | 327/132 |
| 2011/0279153 A1* | 11/2011 | Zhu et al. | 327/131 |
| 2013/0147527 A1* | 6/2013 | Zhu et al. | 327/131 |

\* cited by examiner

LOW-POWER PROGRAMMABLE OSCILLATOR AND RAMP GENERATOR

RELATED CASES

The present application claims priority to U.S. Provisional application Ser. No. 61/578,214, "LOW-POWER PROGRAMMABLE OSCILLATOR & RAMP GENERATOR," filed Dec. 20, 2011, and which is hereby incorporated by reference for all purposes.

TECHNICAL FIELD

The present disclosure relates to a programmable oscillator and ramp generator, and more specifically to a combined low-power programmable oscillator and ramp generator circuit.

BACKGROUND OF THE INVENTION

Circuits for generating a ramp signal are known, as are circuits for generating a clock signal. These circuits are generally separate and discrete, and must be synchronous with each other to avoid misoperation associated systems and components. Synchronizing these two separate circuits requires complex and expensive circuitry.

SUMMARY OF THE INVENTION

A circuit for generating a signal provided. The circuit includes a first transistor having a drain, a gate and a source, and a second transistor having a drain, a source and a gate coupled to the gate of the first transistor to form current mirror. A current source coupled to the source of the first transistor generates the current that is mirrored by the second transistor. A diode-connected transistor having a drain coupled to the source of the second transistor, a source and a gate that forms an output is coupled at its source to a first terminal of a variable resistor. A second terminal of the variable resistor is coupled to a capacitor, and a switch is used to short the capacitor when the voltage across the capacitor equals a reference voltage, so as to form a relaxation oscillator.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspect of the disclosure can be better understood with reference the following drawings. The components in the drawings are not necessarily to scale, emphasis instead being placed upon clearly illustrating the principles of the present disclosure. Moreover, in the drawings, like reference numerals designate corresponding parts throughout the several views, and in which.

DETAILED DESCRIPTION OF THE INVENTION

Figure 1:
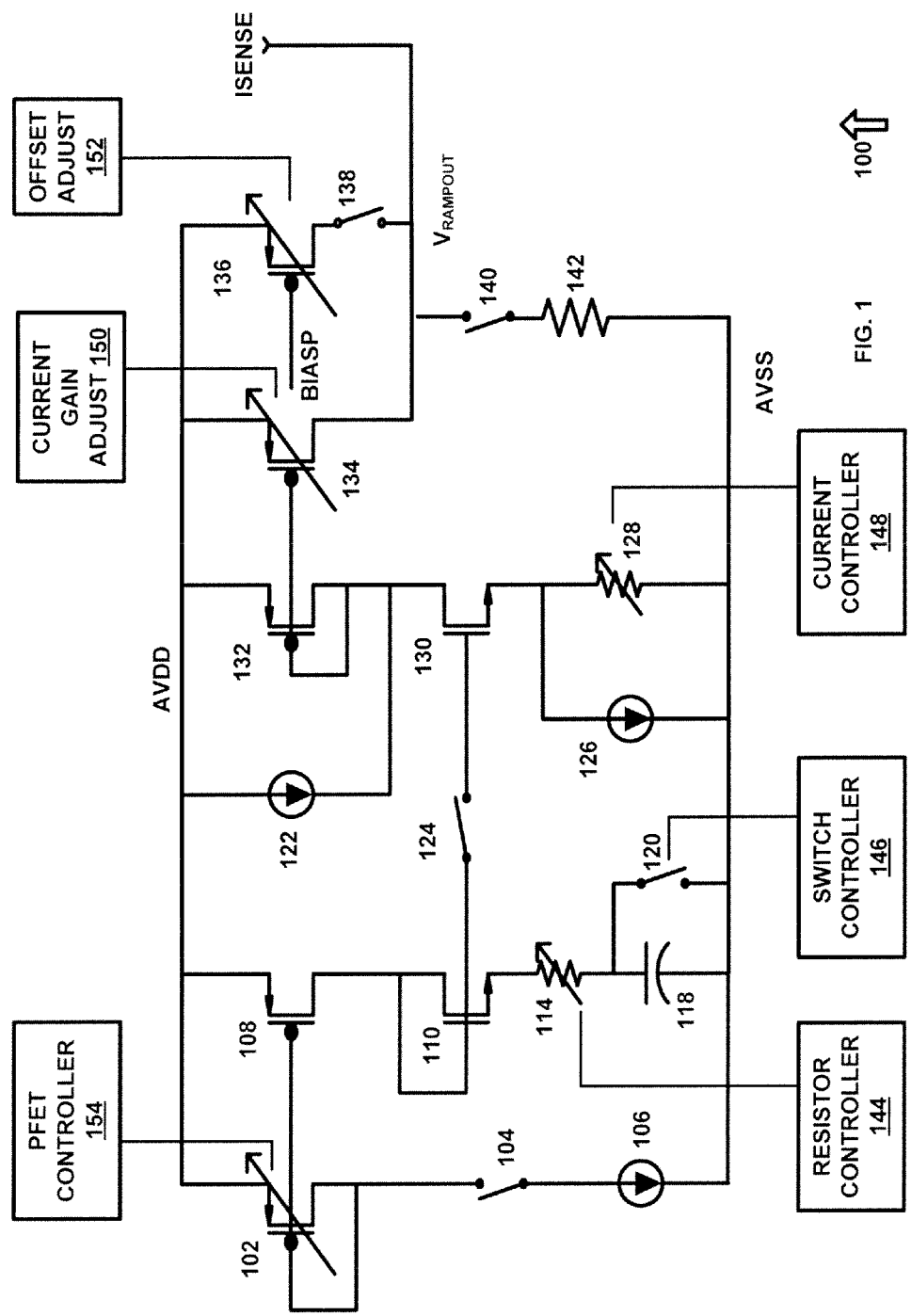
FIG. 1 is a diagram of a circuit for providing combined ramp generator and oscillator in accordance with an exemplary embodiment of the present disclosure.

In the description that follows, like parts are marked throughout the specification and drawings with the same reference numerals. The drawing figures might not be to scale and certain components can be shown in generalized or schematic form and identified by commercial designations in the interest of clarity and conciseness.

Many pulse width modulation (PWM) based systems require both clock signals and sawtooth voltage waveform signals to function, such as those used in DC-DC converters and Class-D amplifiers. For optimum performance, the sawtooth waveform signals should be synchronous to the clock source signals without unnecessary jumps in the waveform. Also, because DC-DC converters and Class-D amplifiers are typically used in applications where power efficiency is of high importance, the clock source and sawtooth waveform generator should ideally consume very little current. Finally, these systems can further benefit from programmability on the sawtooth waveform offset, amplitude and frequency.

Typically, the clock source and sawtooth waveform generator are separate circuits. The clock source can be taken from a suitable crystal oscillator, ring oscillator, phase locked loop, or her suitable circuit, and the clock source is also used as an input to synchronize a sawtooth waveform generator. Without calibration, the natural time constant of the sawtooth waveform generator will likely be different from that of the clock source, which can lead to discrepancies in the waveform that can adversely impact the performance of the system.

The present disclosure combines relaxation oscillator circuit and sawtooth waveform generator circuit into a single circuit. The relaxation oscillator can be implemented in the above-mentioned manners, and a constant current source (either poly-resistor based or discrete-resistor based, depending on the frequency accuracy requirements) can be used to charge a capacitor linearly. A comparator can be used to measure the capacitor voltage and compare that voltage to a reference voltage. When the comparator output toggles, the capacitor is discharged (such as by using a constant current in the opposite direction, by using a low-resistance switch to discharge rapidly, depending on the desired shape, or in other suitable manners).

The disclosed ramp generation output is linear and does not suffer from the body effect, which can be accomplished as follows. A reference voltage is generated by inserting a diode in series with the capacitor, and this circuit is used to drive an open-loop buffer in the form of a source follower. The output buffer can thus drive a voltage that matches that of the relaxation oscillator: a sawtooth waveform with little distortion. This buffer is capable of driving the voltage into a resistor to convert the voltage to a current, and the current offset and gain can be readily adjusted without affecting the oscillator. The resulting current can be driven into another resistor if a voltage sawtooth waveform is needed, or added to other currents, such as a sensing current if suitable.

As used herein, "hardware" can include a combination of discrete component an integrated circuit, an application-specific integrated circuit, a field programmable gate array, or other suitable hardware. As used herein, "software" can include one or more objects, agents, threads, lines of code, subroutines, separate software applications, two or more lines code or other suitable software structures operating in two or more software applications or on two or more processors, or other suitable software structures. In one exemplary embodiment, software can include one or more lines of code or other suitable software structures operating in a general purpose software application, such as an operating system, and one or more lines of code or other suitable software structures operating in a specific purpose software application.

FIG. 1 is a diagram of a circuit 100 for providing combined ramp generator and oscillator in accordance with an exemplary embodiment of the present disclosure. Circuit 100 provides a clock signal that is synchronized to a ramp signal in a single circuit.

The first branch of circuit 100 includes power switch 104, variable PFET 102, PFET controller 154 and current source 106. Power switch 104 disables operation of circuit 100, and variable PFET 102 can be controlled to vary the amount of current flowing through current source 106. In one exemplary embodiment, variable PFET 102 can include a plurality of transistors connected in parallel, where PFET controller 154 receives a control signal or control data input and converts the input to a series of bits that are used to turn predetermined combinations of the parallel transistors on or off. The number of transistors and associated current can be used to control the frequency of oscillation, as described herein.

The second branch of circuit 100 provides a relaxation oscillator that includes PFET 108, which is an array of transistors that forms a current mirror with variable PFET 102, NFET 110, programmable resistor 114, capacitor 118 and switch 120. Programmable resistor 114 forms a series resistor-capacitor circuit in conjunction with capacitor 118, and can be varied by resistor controller 144 to select the effective clock frequency. In one exemplary embodiment, the programmable resistor can have resistance values that are coordinated with the value of capacitor 118, where resistor controller 144 is configured to receive a three bat code that is used to set the clock frequency in the following increments:

| | |
|---|---|
| 000 | 400 KHz |
| 001 | 533 KHz |
| 010 | 800 KHz |
| 011 | 1600 KHz |
| 100 | 200 KHz |
| 101 | 229 KHz |
| 110 | 267 KHz |
| 111 | 320 KHz |

In one exemplary embodiment, the three bit code can be used to control switches to reconfigure an array of resistors to be connected in series and parallel as needed to provide a total resistance value that results in the desired frequency, such as by determining the voltage rise time from the equation:

$$Vc(t)=(AVDD-AVSS)(1-e^{-t/RC})$$

Where
Vc(t)=voltage across the capacitor as a function of time.
AVDD=high supply voltage
AVSS=low supply voltage
R=resistance in ohms
C=capacitance in farads Other suitable frequency increments can also or alternatively be used. Resistor controller 144 can be implemented in hardware or a suitable combination of hardware and software, and can receive a control signal such as a data value or input signal level and can translate the control signal into a corresponding three bit code. Likewise, the frequency can be controlled using PFET controller 154, where an increase in the amount of current for given resistance setting will result in a faster rise time for the voltage drop cross capacitor 118.

Switch 120 is used to reset capacitor 11e when the voltage across it is equal to a reference voltage, and can be controlled by a signal generated by a comparator in switch controller 146 that compares the capacitor voltage to the reference voltage and which generates a signal to open switch 120, or in other suitable manners. Switch 124 is normally closed, such that the gate voltage that is generated at NFET 110 is also generated at the gate of NFET 130, but can be opened in order to disable the ramp output where suitable. Current sources 122 and 126 can be selected to provide currents of equal magnitude, so as to improve the operation speed of NFET 130 by biasing NFET 130 at a minimum level of operation to avoid time delays due to turning NFET 130 on. Adjustable resistor 128 is used to control the current magnitude through PFET 132 and NFET 130, and is controlled by current controller 128. In one exemplary embodiment, adjustable resistor 128 can be a plurality of resistors connected by switches that allow the resistors to be selectively configured in series or parallel combinations, where the switch settings are controlled with a suitable number of bits output by current controller 128, and where current controller 128 receives a signal or data and converts the signal or data into a suitable binary output, or in other suitable manners.

Variable PFET 134 is controlled by current gain adjust 150 to provide an adjustable current gain to the output at $V_{RAMPOUT}$. In one exemplary embodiment, current gain adjust can control the number of parallel translators of variable PFET 134, as to increase or decrease the current gain provided by variable PFET 134. Variable PFET 136 is controlled by offset adjust 152 to adjust the voltage offset of $V_{RAMPOUT}$. $V_{RAMPOUT}$ is the ramp voltage output that is synchronized with the clock signal generated by the comparator in conjunction with the relaxation oscillator. ISENSE is used to detect an overcurrent condition in order to shut down circuit 100, and switch 140 and load 142 are used to provide a test load, such that switch 140 is open during normal operation.

In operation, resistor 14 of circuit 100 is adjusted to control the speed at which capacitor 118 charges. When the voltage across capacitor 118 reaches a predetermined reference voltage, switch 120 is opened to discharge capacitor 118, which operates as a relaxation oscillator to generate a clock signal having a selectable frequency. In addition, the voltage across the series RC circuit is used to control an output driver that generates a ramp signal, such as for use in a DC to DC converter, a class D amplifier, or for other suitable purposes. The ramp signal of circuit 100 is synchronized to the clock signal, which prevents system misoperation.

Figure 2:
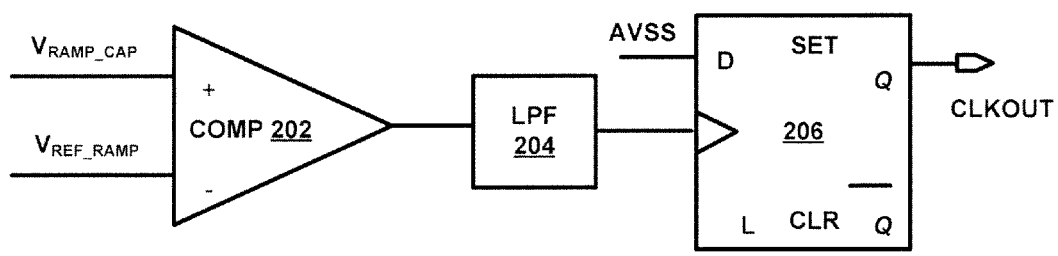
FIG. 2 is a switch control block diagram in accordance with an exemplary embodiment of the present disclosure.

FIG. 2 is a switch control block diagram 200 in accordance with an exemplary embodiment of the present disclosure. Switch control block diagram 200 includes comparator 202, which receives the ramp capacitor voltage and the reference voltage and generates an output when the ramp capacitor voltage equals the reference voltage. The output filtered by low pass filter 204 and is provided to latch 206, which controls the minimum pulse width the output clock signal. In addition, the output of comparator 202 can be used to control switch 120 of circuit 100, so as to open switch 120 to discharge capacitor 118.

Figure 3:
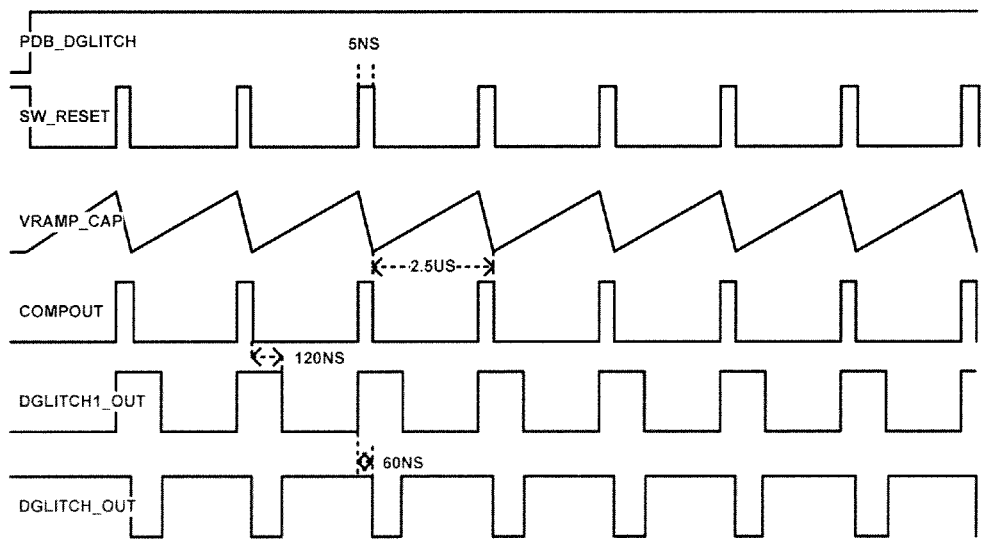
FIG. 3 is a diagram of exemplary waveforms of the circuits in FIGS. 1 and 2 of the present disclosure.

FIG. 3 is a diagram of exemplary waveforms of the circuits in FIGS. 1 and 2 of the present disclosure. SW_RESET is a signal that is used to drive switch 120 of FIG. 1, and it can be seen that VRAMP_CAP peaks at the magnitude of the reference voltage when SW_RESET transitions from low to high. As discussed above with respect to switch control block diagram 200, SW_RESET can be used to control switch 120 or circuit 100, which causes the voltage stored in capacitor 120 to discharge. The length of time that the SW_RESET signal stays high is function of the response time to open switch 120 and for the value of $V_{RAMP\_CAP}$ to change at the input to comparator 202. The slope of the increase in VRAMP_CAP (and hence the frequency of the relaxation oscillator) is determined by the value of variable resistor 114. The waveforms shown for COMPOUT, DGLITCH_OUT and DGLITCH1_OUT are related to the signals generated by the control circuitry as shown in FIG. 4.

Figure 4:
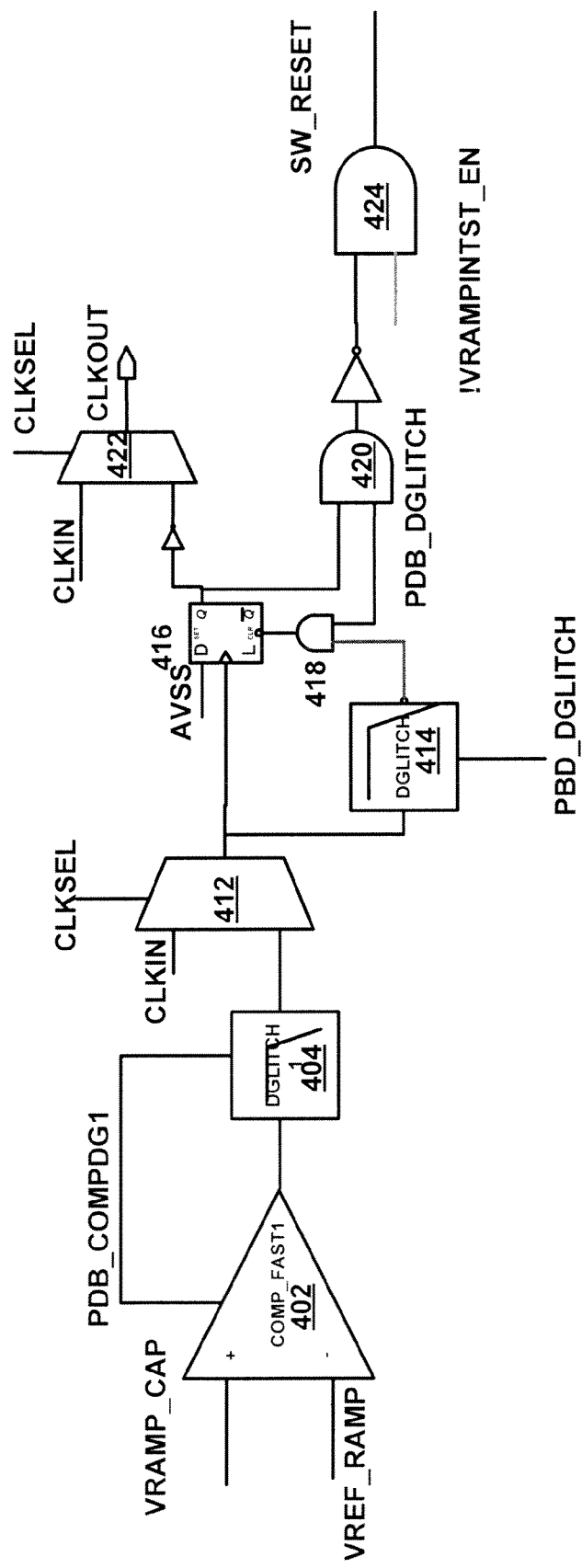
FIG. 4 is a diagram of control circuitry in accordance with an exemplary embodiment of the present disclosure.

FIG. 4 is a diagram of control circuitry 400 in accordance with an exemplary embodiment of the present disclosure. Control circuitry 400 includes comparator 402, which receives the voltage drop across the capacitor of the relaxation oscillator, such as capacitor 118 of FIG. 1, and which compares the voltage a reference voltage. The output is provided to dc-glitch low pass filter 404, and both comparator 402 and low pas filter 404 can be deactivated by PDB_COMPDG1 when an external clock signal is being provided. Multiplexer 412 is used to select between the external clock signal and the internal clock signal as a function of a clock select signal CLKSEL. The output from multiplexer 412 is provided to dc-glitch low pass filter 414 and latch 416, which are connected to AND gates 418, 429 and 424 and multiplexer 422 as shown to generate a switch reset output SW_RESET and a clock output CLKOUT.

In operation, control circuitry 400 allows an internal or external clock to be selected, and provides additional low pass filtering of the internal clock signal to prevent misoperation due to high frequency transients.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A circuit for generating a signal comprising:
   a first transistor having a drain, a gate and a source;
   a second transistor having a drain, a source and a gate coupled to the gate of the first transistor to form a current mirror;
   a current source directly coupled to the source of the first transistor;
   a diode-connected transistor having a drain coupled to the source of the second transistor, a source and a gate that forms a ramp signal output;
   a variable resistor having a first terminal coupled to the source of diode-connected transistor and a second terminal; and
   a capacitor coupled to the second terminal of the variable resistor.

2. The circuit of claim 1 further comprising a comparator receiving the output and a reference voltage and generating a switch control signal.

3. The circuit of claim 2 further comprising a switch in parallel with the capacitor, wherein the switch receives the switch control signal and operates to discharge the capacitor.

4. The circuit of claim 3 further comprising a current gain adjust circuit coupled to the output, for adjusting a current gain of an output signal.

5. The circuit of claim 4 further comprising an offset adjust circuit coupled to the output for adjusting an offset of the output signal.

6. The circuit of claim 3 further comprising:
   a transistor coupled to the ramp signal output; and
   a current gain adjust controller coupled to the gate of the transistor and configured to adjust a current gain of an output signal.

7. The circuit of claim 3 further comprising:
   a transistor coupled to the ramp signal output; and
   an offset adjust controller coupled to the gate of the transistor and configured to adjust an offset of an output signal.

8. The circuit of claim 1 further comprising:
   a transistor controller; and
   wherein the first transistor further comprises a plurality of first transistors connected in parallel, the second transistor further comprises a plurality of second transistors connected in parallel, and the transistor controller controls a number of the plurality of first transistors and of the plurality of second transistors that are in a conducting state.

9. The circuit of claim 1 wherein the variable resistor has a resistance value configured as a function of frequency control data.

10. The circuit of claim 1 wherein the first transistor comprises a variable transistor having a number of parallel transistors configured as a function of frequency control data.

11. The circuit of claim 1 further comprising a variable transistor having a number of parallel transistors configured as a function of the ramp signal current data.

12. The circuit of claim 1 further comprising a programmable ramp signal offset generator coupled to receive the ramp signal output and ramp signal offset data and configured to generate a ramp signal having a voltage offset as a function of the ramp signal offset data.

13. A method for generating a signal using the circuit of claim 1, the method comprising:
   applying a current to the capacitor;
   comparing a voltage drop across the capacitor with a reference voltage;
   discharging the capacitor when the voltage drop across the capacitor equals the reference voltage;
   generating the ramp signal output using the voltage drop across the capacitor; and
   generating a clock output using the voltage drop across the capacitor.

14. The method of claim 13 wherein the discharging the capacitor when the voltage drop across the capacitor equals the reference voltage comprises actuating a switch to short the capacitor.

15. The method of claim 13 further comprising controlling a frequency of oscillation using the variable resistor coupled in series with the capacitor.

16. The method of claim 13 wherein the applying the current to the capacitor comprises:
   receiving control data for selecting a frequency of operation; and
   modifying a circuit component as a function of the control data.

17. The method of claim 16 wherein the modifying the circuit component as a function of the control data comprises modifying a number of parallel transistors that are in an on state.

18. The method of claim 16 wherein the modifying the circuit component as a function of the control data comprises modifying a variable resistance value.

* * * * *